United States Patent
Wang

(10) Patent No.: US 11,597,655 B2
(45) Date of Patent: Mar. 7, 2023

(54) SIC MEMBER

(71) Applicant: ADMAP INC., Tamano (JP)

(72) Inventor: Zhida Wang, Tamano (JP)

(73) Assignee: ADMAP INC., Tamano (JP)

(*) Notice: Subject to any disclaimer, the term of this patent is extended or adjusted under 35 U.S.C. 154(b) by 687 days.

(21) Appl. No.: 16/611,505

(22) PCT Filed: Apr. 24, 2019

(86) PCT No.: PCT/JP2019/017417
§ 371 (c)(1),
(2) Date: Nov. 7, 2019

(87) PCT Pub. No.: WO2020/003722
PCT Pub. Date: Jan. 2, 2020

(65) Prior Publication Data
US 2020/0231448 A1 Jul. 23, 2020

(30) Foreign Application Priority Data
Jun. 27, 2018 (JP) ................. 2018-121523

(51) Int. Cl.
*C01B 32/956* (2017.01)
*H01L 21/683* (2006.01)

(52) U.S. Cl.
CPC .......... *C01B 32/956* (2017.08); *H01L 21/683* (2013.01)

(58) Field of Classification Search
None
See application file for complete search history.

(56) References Cited

U.S. PATENT DOCUMENTS

| 2011/0308459 A1 | 12/2011 | Yoshimoto |
| 2013/0001703 A1* | 1/2013 | Sugawara ........... H01L 29/0657 257/E27.06 |
| 2013/0157067 A1 | 6/2013 | Kawamoto et al. |

(Continued)

FOREIGN PATENT DOCUMENTS

| CN | 102264944 A | 11/2011 |
| CN | 105555999 A | 5/2016 |
| JP | H04-199614 A | 7/1992 |

(Continued)

OTHER PUBLICATIONS

Jul. 23, 2019 International Search Report issued in International Patent Application No. PCT/JP2019/017417.

(Continued)

*Primary Examiner* — Jeffrey D Washville
(74) *Attorney, Agent, or Firm* — Oliff PLC

(57) ABSTRACT

A technology for securing favorable appearance of a SiC member, the SiC member includes: a first SiC layer having a first upper surface having a concavo-convex shape and a first lower surface; and a second SiC layer having a second upper surface and a second lower surface, the second lower surface being in contact with the first upper surface and having a concavo-convex shape corresponding to that of the first upper surface. The second SiC layer has a recess concaved from the second upper surface toward the second lower surface side and a flat bottom surface, and the bottom surface of the recess is placed upward of the second lower surface.

4 Claims, 8 Drawing Sheets

(56) References Cited

U.S. PATENT DOCUMENTS

2016/0201219 A1    7/2016   Corea et al.
2016/0281227 A1    9/2016   Kobayashi et al.

FOREIGN PATENT DOCUMENTS

| JP | 2010-185091 A | 8/2010 |
|----|---------------|--------|
| JP | 2012-049220 A | 3/2012 |
| JP | 2016-046464 A | 4/2016 |
| JP | 2016-535432 A | 11/2016 |
| TW | 201513264 A | 4/2015 |

OTHER PUBLICATIONS

Feb. 21, 2020 Office Action issued in Taiwanese Office Action 108121946.

* cited by examiner (a)

(b)

(c)

(a)

(b)

(c)

SIC MEMBER

FIELD OF THE INVENTION

The present invention relates to a SiC member having a recess on a surface and a manufacturing method thereof.

BACKGROUND OF THE INVENTION

A SiC member formed of silicon carbide (SiC) has excellent properties such as high durability, high acid resistance, and low specific resistance, and is widely used as a component for a semiconductor manufacturing apparatus. In addition, such a SiC member has a recess on its surface as a housing portion for housing a processing target wafer. For example, Patent Document 1 discusses a technique of using the SiC member having a recess on its surface as a focus ring for a plasma etching apparatus. In addition, the SiC member requires a strict specification such as high durability or high purity. In order to satisfy such a requirement, Patent Document 1 discusses a SiC member formed of CVD-SiC having excellent physical and chemical properties. The CVD-SiC refers to SiC formed through chemical vapor deposition (CVD).

CITATION LIST

Patent Documents

Patent Document 1: Japanese Unexamined Patent Application Publication No. 2012-49220

SUMMARY OF THE INVENTION

In the semiconductor manufacturing apparatus, a product defect may occur in a wafer due to even a slight processing variation. In addition, since the semiconductor manufacturing apparatus is used to treat a large number of wafers in a factory, a problem of the product defect of the wafer may spread to a large number of wafers without limiting to only a single wafer. Therefore, a user of the semiconductor manufacturing apparatus strictly controls the quality of the semiconductor manufacturing apparatus and components used therein.

The SiC member is formed to have a shape and a dimension as desired by grinding a SiC plate. The SiC plate is formed relatively thick, for example, by repeating the CVD several times. As a result, the SiC plate has a multi-layered structure having a plurality of SiC layers. The recess on the surface of the SiC member is formed through spot facing for the SiC plate. In this case, an interface between upper and lower SiC layers sometimes appears on the bottom surface of the recess. Such an interface may concern a user of the semiconductor manufacturing apparatus in some cases.

In view of such a problem, the present invention provides a technology for securing favorable appearance of the SiC member.

In order to address the aforementioned problems, according to the first aspect, there is provided a SiC member including: a first SiC layer having a first upper surface having a concavo-convex shape and a first lower surface; and a second SiC layer having a second upper surface and a second lower surface, the second lower surface being in contact with the first upper surface and having a concavo-convex shape corresponding to the concavo-convex shape of the first upper surface, wherein the second SiC layer has a recess concaved from the second upper surface toward the second lower surface side and a flat bottom surface, and the bottom surface of the recess is placed upward of the second lower surface.

In this aspect, an interface is formed between the first upper surface of the first SiC layer and the second lower surface of the second SiC layer. In addition, since the first upper surface has a concavo-convex shape, and the second lower surface has a concavo-convex shape corresponding thereto, the interface between the first upper surface and the second lower surface also has a concavo-convex shape. According to the first aspect, the interface does not appear on the bottom surface of the recess. Therefore, it is possible to secure favorable appearance of the SiC member.

The phrase "concavo-convex shape corresponding to the concavo-convex shape" refers to a case where one surface is convex, and the other surface is concave as a complementary structure. Note that the terminology indicating a direction, such as an upper surface, a lower surface, an upper side, and a lower side, does not define a direction at the time of use of the SiC member.

According to the second aspect, it is conceivable that the SiC member further includes a third SiC layer having a third upper surface and a third lower surface, the third upper surface being in contact with the first lower surface, wherein the bottom surface of the recess is separated from the first upper surface by a first distance, and the third lower surface is separated from the first lower surface by a second distance equal to the first distance.

In this case, the first upper surface and the second lower surface form a first interface, and the first lower surface and the third upper surface form a second interface. In the second aspect, the second distance is equal to the first distance. Therefore, similar to the case where the first interface does not appear on the bottom surface of the recess, the second interface does not appear on the third lower surface.

According to the third aspect, it is conceivable that the first lower surface has a concavo-convex shape, and the third upper surface has a concavo-convex shape corresponding to the concavo-convex shape of the first lower surface.

According to the fourth aspect, it is conceivable that the concavo-convex shape of the first upper surface is formed by a surface entirely curved on the first upper surface.

According to the fifth aspect, it is conceivable that the SiC member is a susceptor having the recess as a housing portion for housing a wafer.

DESCRIPTION OF EMBODIMENTS

Embodiments of the present invention will now be described with reference to the accompanying drawings.

(1) General Configuration

Figure 1:
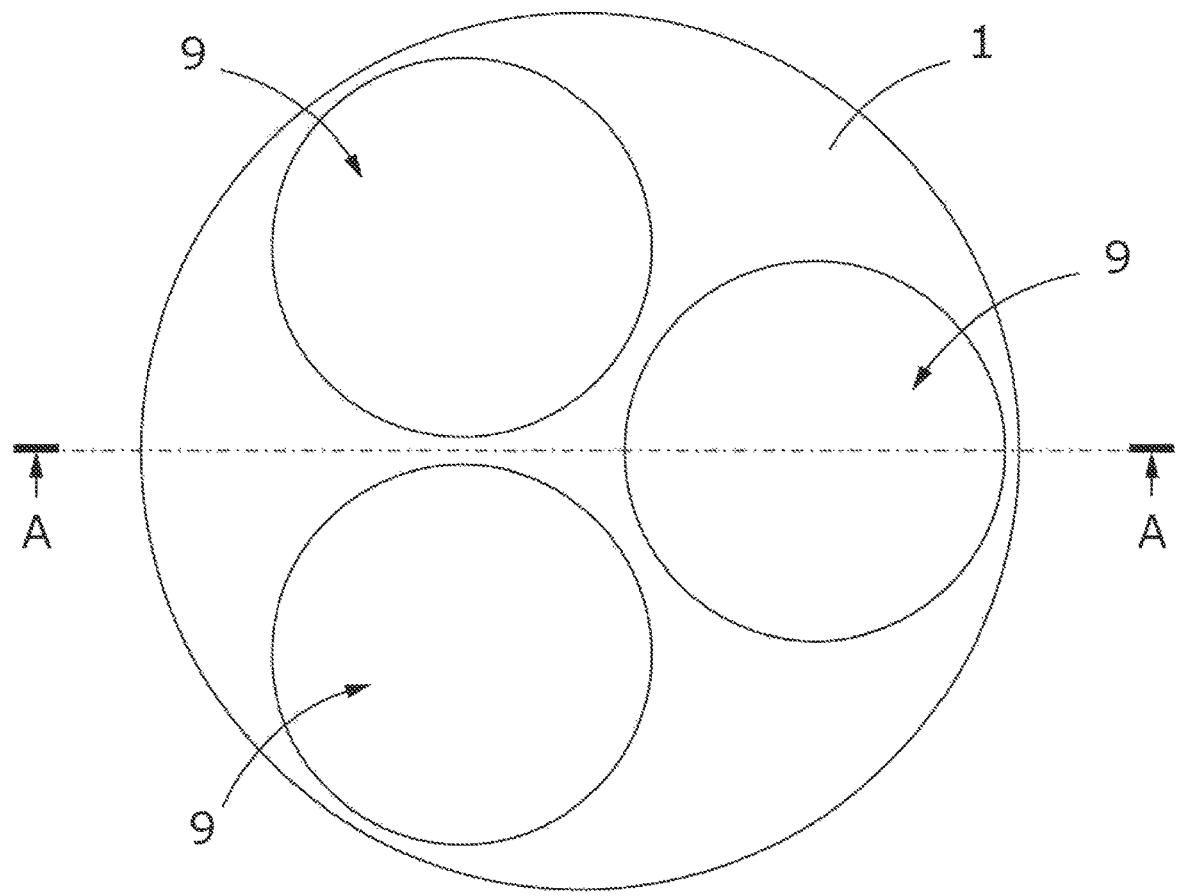
FIG. 1 is a plan view illustrating a susceptor.
Figure 2:
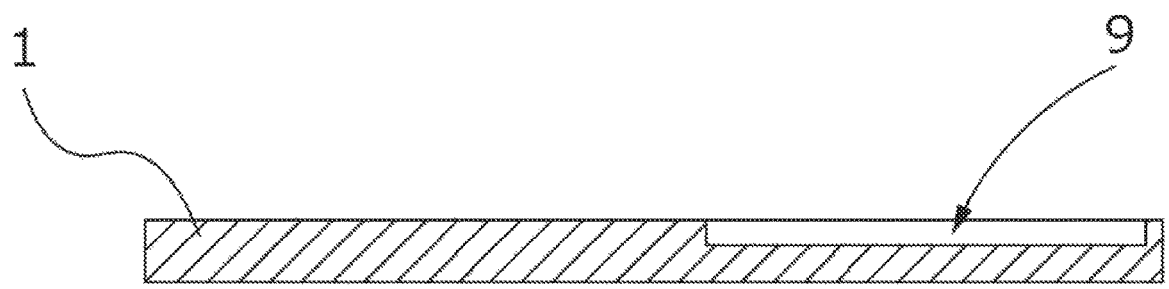
FIG. 2 is a cross-sectional view taken along the line A-A of the plan view of the susceptor.

As illustrated in FIGS. 1 and 2, a susceptor 1 is a disk-shaped SiC member. The susceptor 1 has one or a plurality of circular recesses 9 on its upper surface. According to this embodiment, the susceptor 1 has three recesses 9. The recess 9 is a housing portion for housing a wafer. The susceptor 1 has an outer diameter of, for example, 300 to 500 mm. The susceptor 1 has a thickness of, for example, 1 to 4 mm. The recess 9 has an inner diameter of, for example, 100 to 300 mm.

Figure 3:
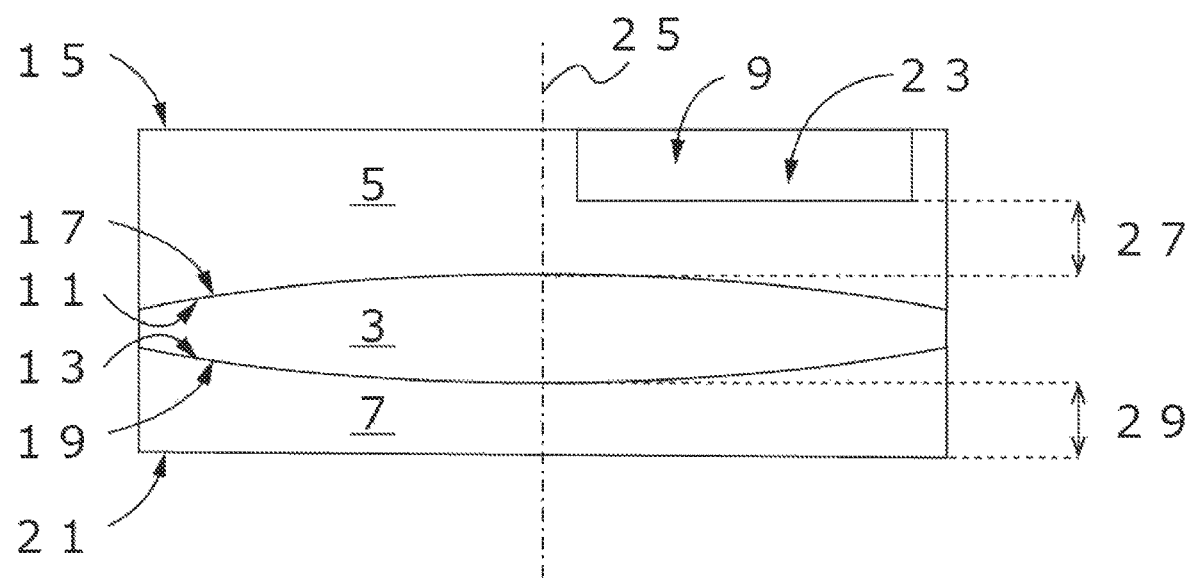
FIG. 3 is a schematic cross-sectional view illustrating the susceptor.

As illustrated in FIG. 3, the susceptor 1 includes a first SiC layer 3 having a first upper surface 11 and a first lower surface 13 and a second SiC layer 5 having a second upper surface 15 and a second lower surface 17. The first upper surface 11 has a concavo-convex shape. The second lower surface 17 is in contact with the first upper surface 11 and has a concavo-convex shape corresponding to the concavo-convex shape of the first upper surface 11. The second SiC layer 5 has a recess 9 which is recessed from the second upper surface 15 to the second lower surface 17 side and has a flat bottom surface 23. According to this embodiment, the concavo-convex shape of the first upper surface 11 is formed by a surface entirely curved on the first upper surface 11. Specifically, the first upper surface 11 is a convex surface protruding upward. A protrusion amount of this convex surface is, for example, 50 to 100 μm. The second upper surface 15 is a flat surface. The bottom surface 23 of the recess 9 is approximately in parallel to the second upper surface 15. The recess 9 has a depth of, for example, 300 to 500 μm.

The susceptor 1 further includes a third SiC layer 7 having a third upper surface 19 and a third lower surface 21. The third upper surface 19 is in contact with the first lower surface 13. The first lower surface 13 has a concavo-convex shape. The third upper surface 19 has a concavo-convex shape corresponding to the concavo-convex shape of the first lower surface 13. According to this embodiment, the concavo-convex shape of the first lower surface 13 is formed by a surface entirely curved on the first lower surface 13. Specifically, the first lower surface 13 is a convex surface protruding downward. This convex surface has a protruding amount of, for example, 50 to 100 μm. The third lower surface 21 is a flat surface approximately in parallel to the second upper surface 15.

As illustrated in FIG. 3, the bottom surface 23 of the recess 9 is placed upward of the second lower surface 17. That is, the bottom surface 23 of the recess 9 is separated from the first upper surface 11 by a first distance 27. In addition, the third lower surface 21 is separated from the first lower surface 13 by a second distance 29 which is equal to the first distance 27. Note that such distances refer to distances on a center axis 25 of the susceptor 1 as illustrated in FIG. 3. The first and second distances 27 and 29 are set to, for example, 100 to 1000 μm.

The concavo-convex shape pattern of the first upper surface 11 can be recognized by observing a cut surface of the susceptor 1. However, it is difficult to recognize it by nondestructively observing it. That is, in the manufacturing procedure of the susceptor 1, the concavo-convex shape pattern, that is, the pattern of the interface between the first and second SiC layers 3 and 5 is unknown. This similarly applies to the concavo-convex shape pattern of the first lower surface 13. That is, in the manufacturing procedure of the susceptor 1, the pattern of the interface between the first SiC layer 3 and the third SiC layer 7 is unknown. According to this embodiment, the first distance 27 and the second distance 29 are equal to each other as described above. As a result, it is possible to reduce a possibility that such an interface appears on the bottom surface 23 of the recess 9 and a possibility that such an interface appears on the third lower surface 21.

(2) Manufacturing Method

Figure 4:
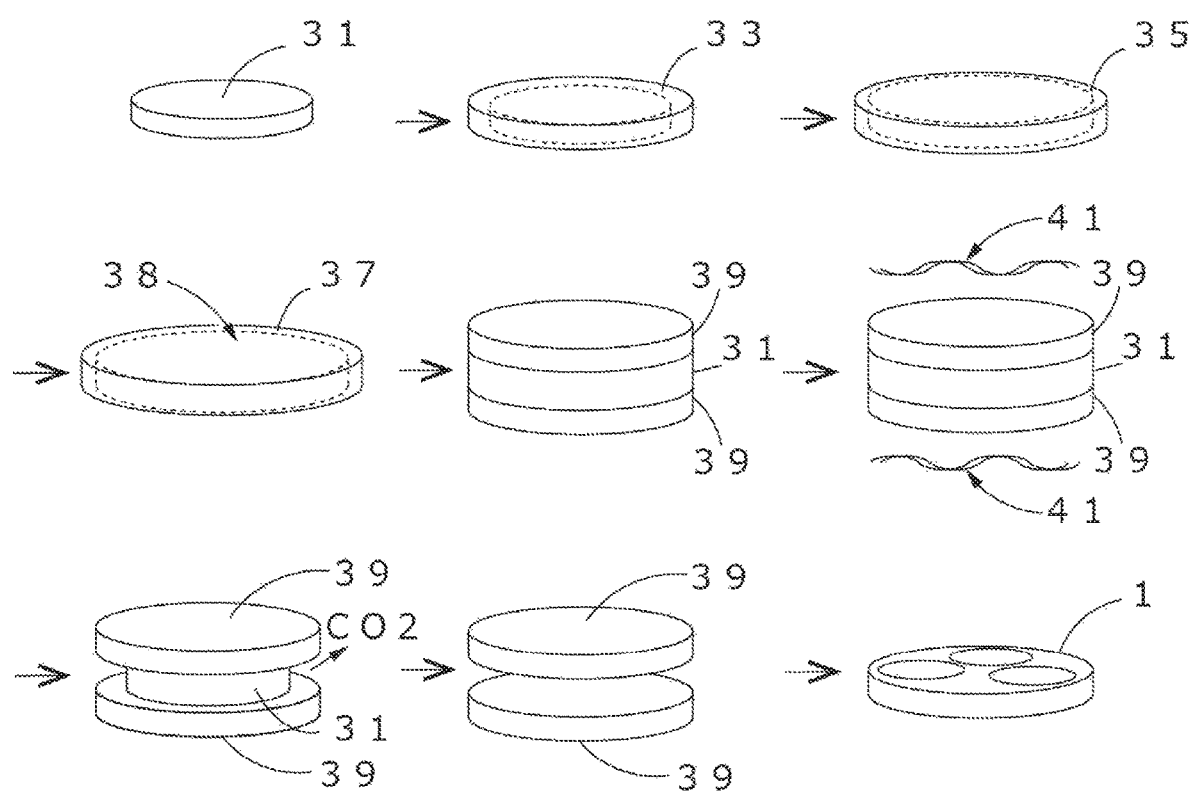
FIG. 4 is a diagram illustrating a manufacturing procedure of the susceptor.

FIG. 4 illustrates a manufacturing method of the susceptor 1.

First, a disk-shaped graphite substrate 31 is prepared. Then, a SiC lower layer 33 that entirely covers the graphite substrate 31 is formed through the CVD. The lower layer 33 is a layer formed of CVD-SiC that forms the third SiC layer 7 of the susceptor 1 as illustrated in FIG. 3. After the lower layer 33 is formed, a SiC middle layer 35 that entirely covers the lower layer 33 is formed through the CVD. The middle layer 35 is a layer formed of CVD-SiC that forms the first SiC layer 3 of the susceptor 1. After the middle layer 35 is formed, a SiC upper layer 37 that entirely covers the middle layer 35 is formed. The upper layer 37 is a layer formed of the CVD-SiC that forms the second SiC layer 5 of the susceptor 1. In this manner, a disk 38 is provided by forming the lower layer 33, the middle layer 35, and the upper layer 37 through the CVD.

Then, an outer circumferential portion of the obtained disk 38 is removed through mechanical machining to expose the graphite substrate 31, so that the graphite substrate 31 and a pair of SiC plates 39 adjoining the upper and lower surfaces of the disk of the graphite substrate 31 are provided. Then, heat treatment is performed to expose the SiC plate 39 under the high-temperature atmosphere 41, so that the graphite substrate 31 is removed through gasification. Specifically, carbon of the graphite substrate 31 is reacted with oxygen contained in the atmosphere to produce carbon dioxide. The SiC plate 39 obtained as a result is subjected to grinding and spot facing to form the susceptor 1.

Figure 5:
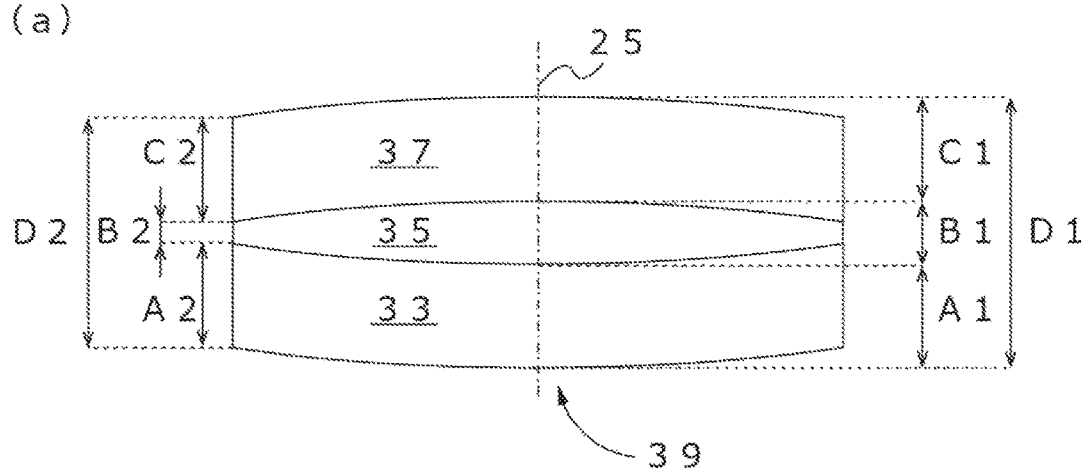
FIG. 5 is a diagram illustrating a procedure for determining positions of upper and lower surfaces of the susceptor.
Figure 5:
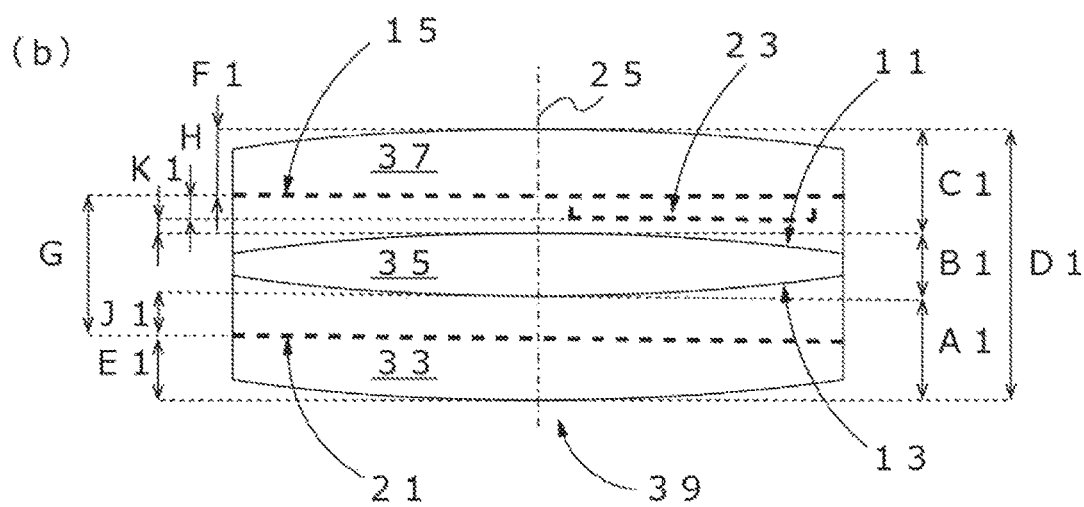
Figure 5:
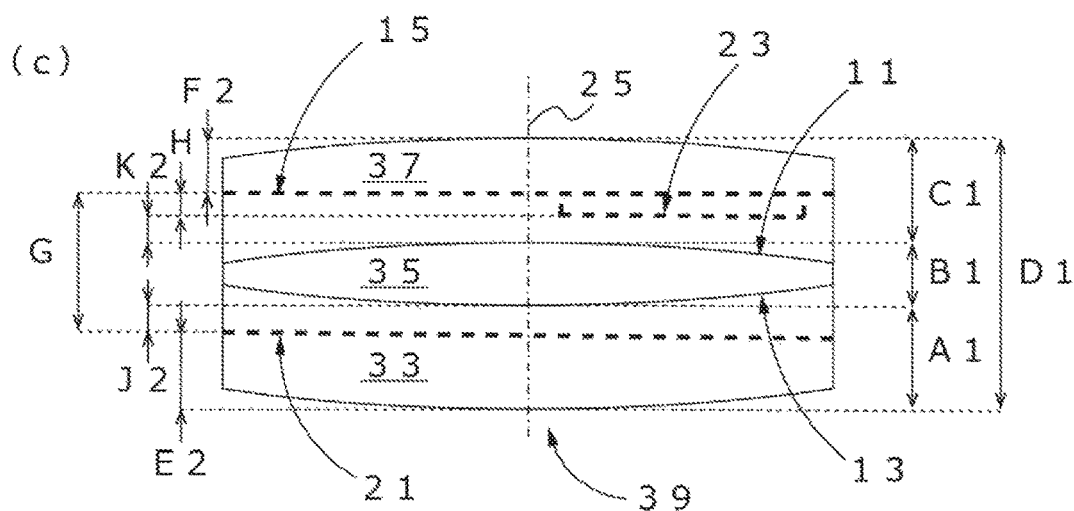

FIG. 5 illustrates a procedure of determining the machining amount for forming the second upper surface 15 and third lower surface 21 of the susceptor 1 from the SiC plate 39 so as to prevent the interface from appearing on the bottom surface 23 of the recess 9. According to this embodiment, the machining amount from the surface of the upper layer 37 of the SiC plate 39 to the second upper surface 15 is set to "F2" as illustrated in FIG. 5(c), and the machining amount from the surface of the lower layer 33 to the third lower surface 21 is set to "E2" as illustrated in FIG. 5(c).

FIG. 5(a) illustrates values to be obtained initially in order to determine the machining amount for forming the second upper surface 15 and the third lower surface 21 of the susceptor 1 from the SiC plate 39 provided through the aforementioned manufacturing method.

The SiC plate 39 includes a lower layer 33, a middle layer 35, and an upper layer 37. Here, the thickness on the center axis 25 of the SiC plate 39 is set to "D1", and the thickness on the outer circumferential surface of the SiC plate 39 is set to "D2". On the outer circumferential surface of the SiC plate 39, the thickness of the lower layer 33 is set to "A2", the thickness of the middle layer 35 is set to "B2", and the thickness of the upper layer 37 is set to "C2". Such actual values A2, B2, C2, and D2 can be measured through microscope observation for the outer circumferential surface of the SiC plate 39. In addition, "D1" can be measured using micrometer measurement at the center of the SiC plate 39. Meanwhile, the thickness A1 of the lower layer 33, the thickness B1 of the middle layer 35, and the thickness of the upper layer 37 on the center axis 25 are unknown.

However, the inventors found that the thickness ratio between the lower layer 33, the middle layer 35, and the upper layer 37 on the outer circumferential surface is equal to that on the center axis 25 due to a deposition property of the CVD-SiC. In this regard, the thicknesses "A1", "B1", and "C1" can be predicted in the following formulas.

$$A1=A2 \times D1/D2$$

$$B1=B2 \times D1/D2$$

$$C1=C2 \times D1/D2$$

FIG. 5(b) shows values to be determined next in order to determine the machining amount for forming the second upper surface 15 and the third lower surface 21 of the susceptor 1.

Here, "G" denotes a thickness of the susceptor 1, and "H" denotes a depth of the recess 9, which is a depth of the spot facing. The values "G" and "H" are the known values determined on the basis of the specification of the susceptor 1. In this regard, first, it is assumed that the machining amount E1 for the lower surface of the lower layer 33 of the SiC plate 39 and the machining amount F1 for the upper surface of the upper layer 37 are equal to each other. In addition, a first distance K1 from the bottom surface 23 of the recess 9 to the first upper surface 11 and a second distance J1 from the third lower surface 21 to the first lower surface 13 of the center axis 25 are predicted.

In this case, assuming that the machining amounts E1 and F1 are set to the same value, if the first distance K1 and the second distance J1 are unbalanced, the machining amounts E2 and F2 are determined such that the first distance K1 and the second distance J1 are equal to each other as described below.

$$E2=E1+(J1-K1)/2$$

$$F2=F1-(J1-K1)/2$$

That is, by determining the machining amounts E2 and F2 as described above, the first distance K2 and the second distance J2 become equal to each other as illustrated in FIG. 5(c).

By determining the machining amounts E2 and F2 such that the first and second distances K2 and J2 are equal to each other in this manner, the bottom surface 23 of the recess 9 can take a sufficient distance with respect to the boundary between the middle layer 35 and the upper layer 37. Similarly, the third lower surface 21 can take a sufficient distance with respect to the boundary between the middle layer 35 and the lower layer 33. As a result, it is possible to prevent an interface from appearing on the bottom surface 23 of the recess 9. In addition, it is possible to prevent an interface from appearing on the third lower surface 21.

(3) Modifications

Needless to say, various forms may be possible within the technical scope of the invention without limiting the embodiments of the invention to the aforementioned examples.

Figure 6:
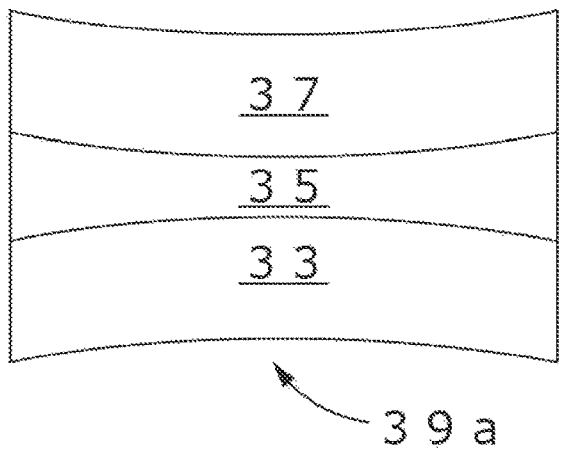
FIG. 6 is a schematic cross-sectional view illustrating a SiC plate according another example.
Figure 6:
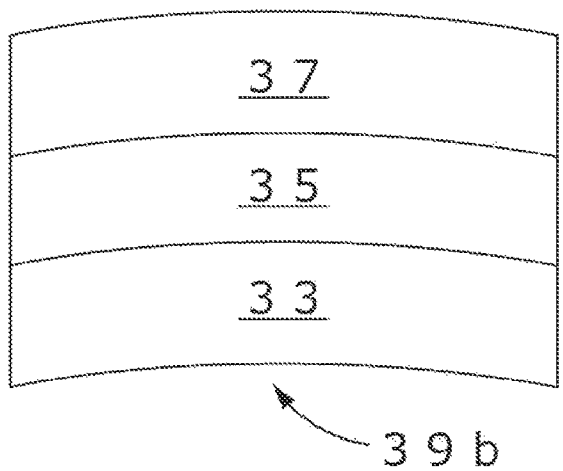
Figure 6:
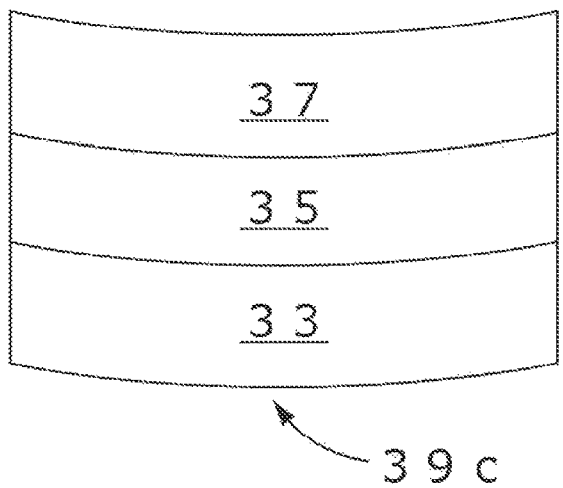

The inventors found that the SiC plate 39 is formed as illustrated in FIG. 6 even using the graphite substrate 31 having the same shape. FIG. 6(a) illustrates a case where the thickness of the lower layer 33, the middle layer 35, and the upper layer 37 on the center axis 25 is smaller than the thickness on the outer circumferential surface, and the SiC plate has a concave shape entirely. FIG. 6(b) shows a case where the thickness of the lower layer 33, the middle layer 35, and the upper layer 37 on the center axis 25 and the thickness on the outer circumferential surface are equal to each other, and the SiC plate has a convex shape entirely. FIG. 6(c) shows a case where the thickness of the lower layer 33, the middle layer 35, and the upper layer 37 on the center axis 25 and the thickness on the outer circumferential surface are equal to each other, and the SiC plate has a concave shape entirely. In any case, the thickness ratio between the lower layer 33, the middle layer 35, and the upper layer 37 is constant on both the center axis 25 and the outer circumferential surface, and the aforementioned calculation method can be applied.

Although a three-layer structure including the first to third SiC layers has been described in the aforementioned embodiment, the invention may apply to any number of layers such as two layers or four layers without limiting thereto.

Although the susceptor 1 has been exemplified as the SiC member, the invention may apply to any SiC member having a recess without limiting thereto. The invention may apply to an etcher ring or any other CVD-SiC member.

(4) Advantages and Effects

Figure 7:
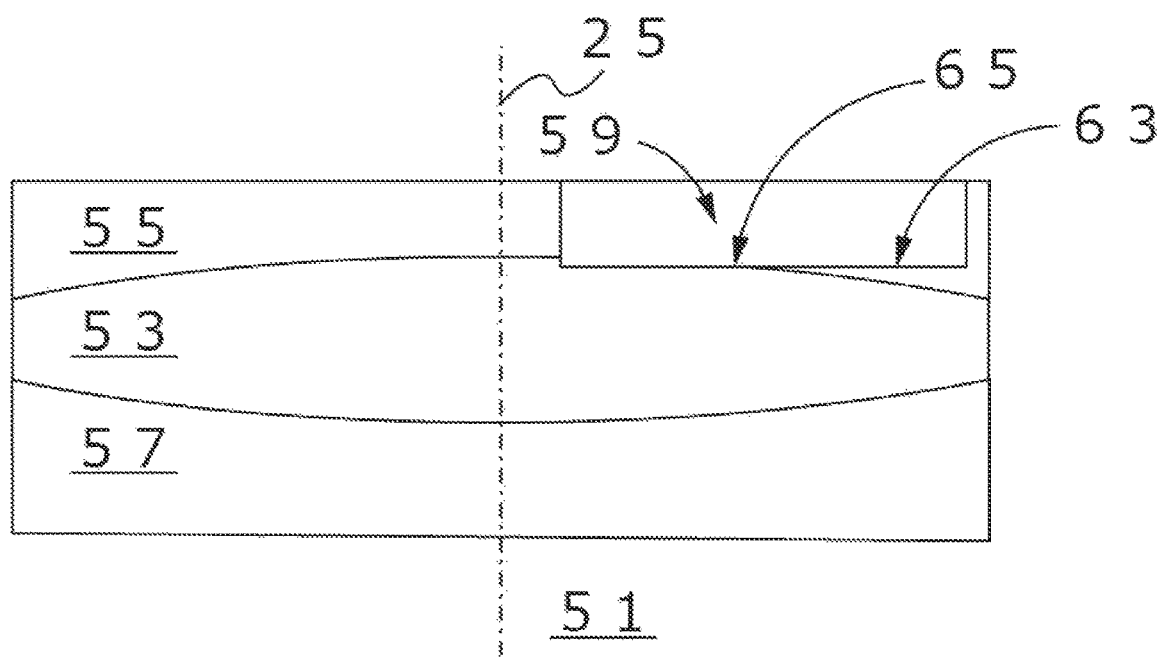
FIG. 7 is a schematic cross-sectional view illustrating a susceptor in a comparative example.
Figure 8:
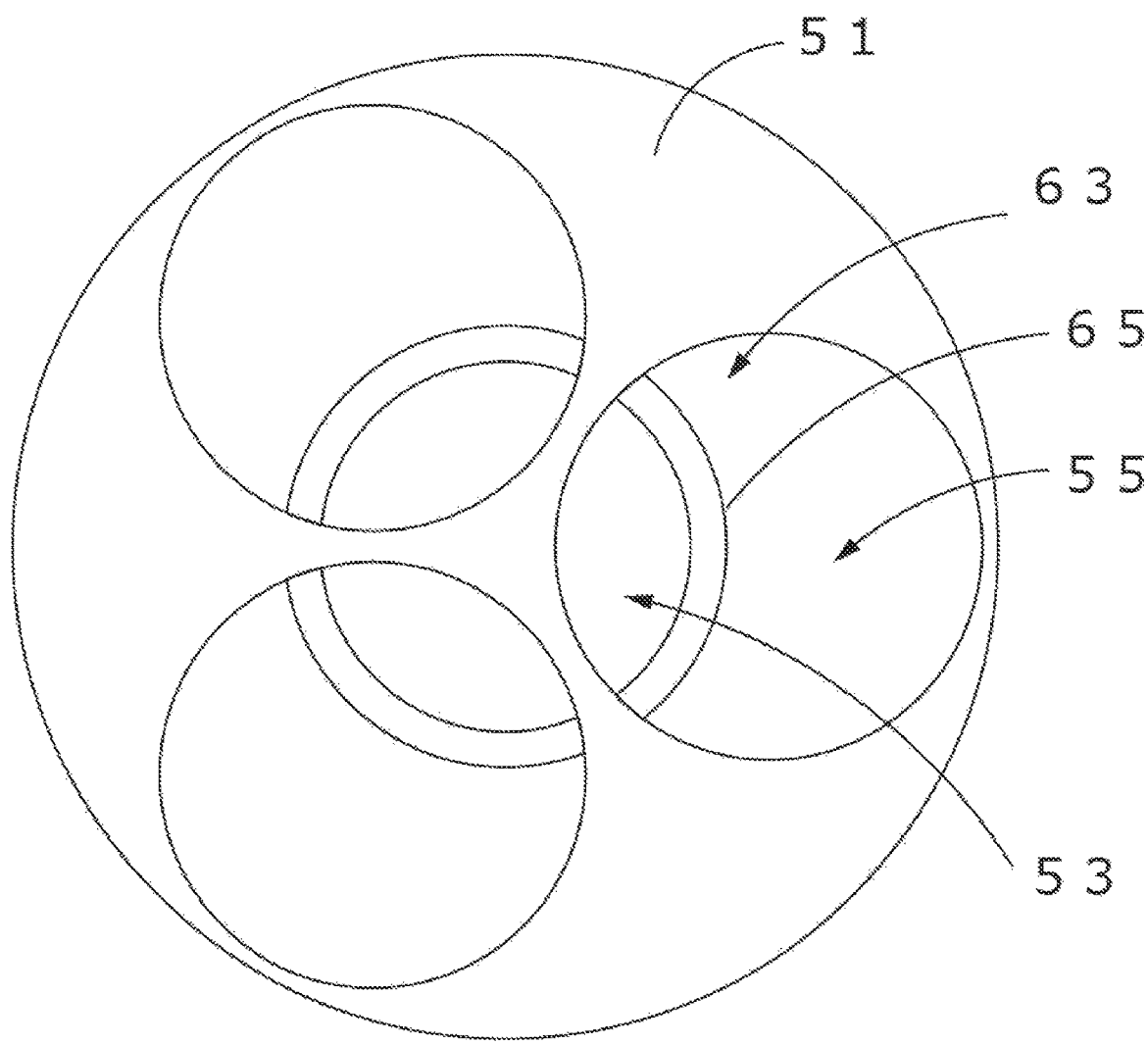
FIG. 8 is a plan view illustrating a susceptor in a comparative example.

As illustrated in FIGS. 7 and 8, a susceptor 51 in a comparative example includes a first SiC layer 53, a second SiC layer 55, a third SiC layer 57, and a recess 59. The recess 59 has a bottom surface 63. An interface 65 between the first and second SiC layers 53 and 55 appears on the bottom surface 63.

However, in the configuration according to the present invention, an interface is formed between the first upper surface 11 of the first SiC layer 3 and the second lower surface 17 of the second SiC layer 5. In addition, the first upper surface 11 has a concavo-convex shape, and the second lower surface 17 has a concavo-convex shape corresponding thereto. Therefore, the interface between the first upper surface 11 and the second lower surface 17 also has a concavo-convex shape. Such an interface does not appear on the bottom surface 23 of the recess 9. Therefore, it is possible to secure favorable appearance of the SiC member 1.

In the configuration according to the present invention, the first interface is formed between the first upper surface 11 and the second lower surface 17, and the second interface is formed between the first lower surface 13 and the third upper surface 19. Since the second distance 29 is equal to the first distance 27, the first interface does not appear on the bottom surface 23 of the recess 9. Similarly, the second interface does not appear on the third lower surface 21.

REFERENCE SIGNS LIST

1 SiC member
3 first SiC layer, second SiC layer
7 third SiC layer,
9 recess,
11 first upper surface,
13 first lower surface,
15 second upper surface,
17 second lower surface,
19 third upper surface, 21 third lower surface,
23 bottom surface,
27 first distance,
29 second distance.

The invention claimed is:

1. A SiC member comprising:
a first SiC layer having a first upper surface having a concavo-convex shape and a first lower surface; and
a second SiC layer having a second upper surface and a second lower surface, the second lower surface being in contact with the first upper surface and having a concavo-convex shape corresponding to the concavo-convex shape of the first upper surface,
wherein the second SiC layer has a recess concaved from the second upper surface toward the second lower surface side and a flat bottom surface, and
the bottom surface of the recess is placed upward of the second lower surface, and
wherein the SiC member is a susceptor having the recess as a housing portion for housing a wafer.

2. The SiC member according to claim 1, further comprising
a third SiC layer having a third upper surface and a third lower surface, the third upper surface being in contact with the first lower surface,
wherein the bottom surface of the recess is separated from the first upper surface by a first distance, and
the third lower surface is separated from the first lower surface by a second distance equal to the first distance.

3. The SiC member according to claim 2,
wherein the first lower surface has a concavo-convex shape, and
the third upper surface has a concavo-convex shape corresponding to the concavo-convex shape of the first lower surface.

4. The SiC member according to claim 1,
wherein the concavo-convex shape of the first upper surface is formed by a surface entirely curved on the first upper surface.

* * * * *